United States Patent [19]

Licht

[11] Patent Number: 4,810,325

[45] Date of Patent: Mar. 7, 1989

[54] LIQUID-PHASE-EPITAXY DEPOSITION METHOD IN THE MANUFACTURE OF DEVICES

[75] Inventor: Steven J. Licht, Bridgewater, N.J.

[73] Assignee: American Telephone and Telegraph Company, AT&T Bell Labs, Murray Hill, N.J.

[21] Appl. No.: 62,039

[22] Filed: Jun. 15, 1987

[51] Int. Cl.$^4$ ............................................. H01L 21/20
[52] U.S. Cl. ......................... 156/624; 148/DIG. 107; 437/91; 437/92; 437/135
[58] Field of Search ........................... 437/91, 92, 135; 148/DIG. 107; 156/624

[56] References Cited

U.S. PATENT DOCUMENTS

| | | | |
|---|---|---|---|
| 3,790,405 | 2/1974 | Levinstein | 156/624 |
| 4,400,445 | 8/1983 | Berkstresser et al. | 156/624 |
| 4,419,417 | 12/1983 | LeCraw et al. | 156/621 |
| 4,544,438 | 10/1985 | Luther et al. | 156/624 |

*Primary Examiner*—William R. Dixon, Jr.
*Assistant Examiner*—Anthony J. Green
*Attorney, Agent, or Firm*—Peter A. Businger

[57] ABSTRACT

Epitaxial layers are grown from a body of molten material which includes flux and layer constituent components; included in the flux are lead oxide and a small amount of boron trioxide. As compared with prior-art processing in the absence of boron trioxide, enhanced yield is realized as believed to be due to reduced adhesion of solidifying material entrained upon withdrawal of a substrate after growth. The method is particularly useful in the manufacture of magnetic domain devices designed to operate at extreme temperatures, as well as in the manufacture of magneto-optic devices such as, e.g., switches, modulators, and isolators.

14 Claims, 1 Drawing Sheet

LIQUID-PHASE-EPITAXY DEPOSITION METHOD IN THE MANUFACTURE OF DEVICES

TECHNICAL FIELD

The invention is concerned with the epitaxial growth of layers in the manufacture of devices.

BACKGROUND OF THE INVENTION

Epitaxial deposition of layers on substrates is of interest in the manufacture of a variety of devices—including, e.g., the manufacture of magnetic domain devices and of magneto-optic devices. Typically, in these devices, deposited layers are magnetic and substrates are nonmagnetic, and substrate and layer materials have compatible garnet structure. Other applications may involve the deposition of nonmagnetic garnet materials or of materials such as, e.g., orthoferrites or magnetoplumbites.

Commercial manufacture of epitaxial-film devices typically involves layer deposition by means of liquid-phase epitaxy processing as disclosed, e.g., in U.S. Pat. No. 3,790,405, issued Feb. 5, 1974 to H. J. Levinstein and, in a variant which is particularly suitable for largescale commercial use in the manufacture of magnetic domain device, in the paper by S. L. Blank et al., "The Simultaneous Multiple Dipping of Magnetic Bubble Garnets", IEEE Transactions on Magnetics, Vol. MAG-16 (1980), pp. 604–609. The cited U.S. Pat. No. 3,790,405, and the cited paper by Blank et al. are incorporated herein by reference.

In the field of magneto-optic devices, particular attention has been paid to bismuth-containing iron garnets; in this respect see, e.g., G. B. Scott et al., "Magnetooptic Properties and Applications of Bismuth Substituted Iron Garnets", IEEE Transactions on Magnetics, Vol. MAG-12 (1976), pp. 292–311. More recently, the use of bismuth-containing garnet layers has been found advantageous also in magnetic domain devices especially as may be required to operate under adverse conditions such as, e.g., unusually high or unusually low temperatures. Such devices are disclosed, e.g., in U.S. Pat. No. 4,419,417, issued Dec. 6, 1983 to R. C. LeCraw et al.

Bismuth-containing iron garnets have been grown by liquid-phase-epitaxy deposition from a variety of melts. For an early mention see D. E. Lacklison et al., "Garnets with High Magnetooptic Figures of Merit in the Visible Region", IEEE Transactions on Magnetics, Vol. MAG-9 (1973), pp. 457–460; for a more recent survey, see W. Toksdorf et al., "The Growth of Bismuth Iron Garnet Layers by Liquid Phase Epitaxy", Thin Solid Films, Vol. 114 (1984), pp. 33–43. Preferred flux compositions including oxides of lead, bismuth, and one or several additional components such as oxides of vanadium, tungsten, molybdenum, or chromium are disclosed in U.S. Pat. No. 4,544,438, issued Oct. 1, 1985, and in pending U.S. patent application Ser. No. 774,665, filed Sept. 11, 1985.

In view of considerable commercial promise of epitaxial-film devices in general, and of devices based on bismuth-containing magnetic iron garnets in particular, high-yield fabrication methods are desired for epitaxial layer deposition. In this respect, particular attention is due methods which are suitable for simultaneous deposition on a plurality of substrates.

SUMMARY OF THE INVENTION

High-quality epitaxial layers are grown by liquid-phase deposition on at least a portion of a supporting substrate surface. The method involves deposition from a fluxed melt comprising lead oxide and a small amount of boron trioxide; as a result of the presence of such boron trioxide, substrate cracking upon removal from the melt is minimized, and enhanced device yield is realized especially in so-called multiple-dipping commercial production.

DETAILED DESCRIPTION

Figure 1:
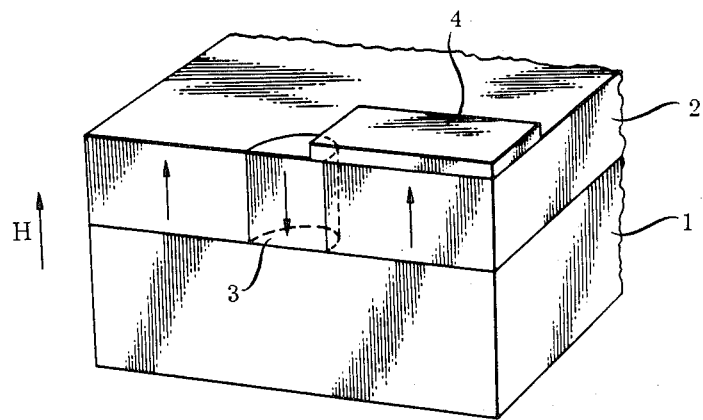
FIG. 1 schematically shows a magnetic domain device including a magnetic garnet layer as made by processing including epitaxial layer growth in accordance with the invention.

Shown in FIG. 1 are substrate 1, magnetic garnet layer 2 of which a portion 3 forms a magnetic domain or "bubble", and metallic overlay 4. The lattice parameters of substrate 1 are compatible with those of magnetic layer 2 and, typically, substrate 1 is made of a nonmagnetic garnet material. Arrows shown in the representation of layer 2 indicate magnetization in a direction parallel to bias field H, with the exception of magnetic domain 3 which is shown magnetized in an antiparallel direction.

Figure 2:
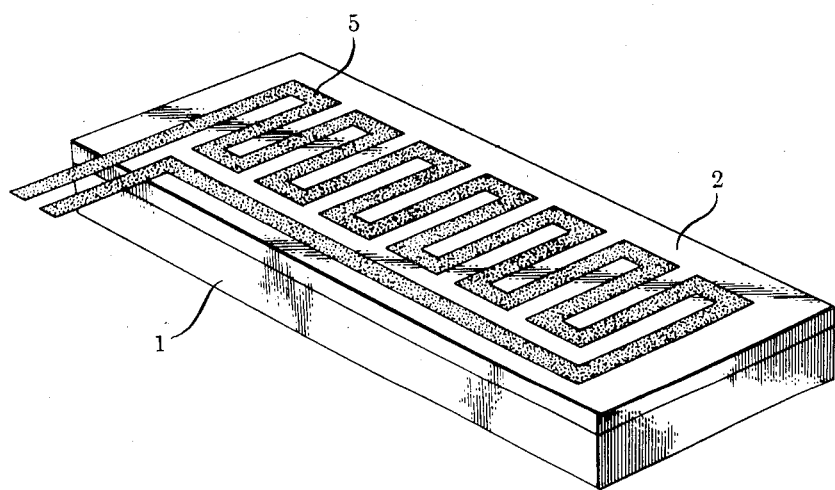
FIG. 2 schematically shows a magneto-optic device including a magnetic garnet layer as made by processing including epitaxial layer growth in accordance with the invention.

Shown in FIG. 2 are substrate 1, magnetic garnet layer 2, and microcircuit 5. Current flowing in microcircuit 5 induces a magnetic field which affects the optical properties of layer 2, thereby influencing light traveling in layer 2. The device can serve, e.g., as an optical switch or modulator.

Typical thickness of layer 2 shown in FIG. 1 and 2 is the range from 1 to 5 micrometers, and preferred compositions of layer material are essentially as represented by the formula

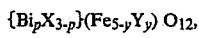

$$\{Bi_p X_{3-p}\}(Fe_{5-y} Y_y) O_{12},$$

where subscripts and subscript expressions represent values which are not less than zero, where X denotes one or several dodecahedral-site substituent elements such as, e.g., yttrium, gadolinium, lutetium, thulium, ytterbium, calcium, lead, erbium, holmium, dysprosium, praseodymium, neodymium, europium, samarium, or terbium, and where Y denotes one or several tetrahedral- or octachedral-site substituent elements such as, e.g., aluminum, gallium, silicon, germanium, lead, and platinum.

Typically, p is greater than or equal to 0.1, and y is less than or equal to 1.5, the latter being primarily in the interest of assuring a Curie temperature above room temperature.

Elements calcium, aluminum, gallium, silicon, and germanium mentioned above are preferably limited to formula amounts not exceeding 1.5, calcium being present, in the interest of valence balancing, in approximately the same amount as silicon and germanium in combination. Material properties may be influenced by choice of substituent elements; for example, the presence of terbium, dysprosium, holmium, or erbium tends to reduce the deflection angle of magnetic bubbles in a magnetic field, and the presence of gadolinium, holmium, or dysprosium diminishes the temperature dependence of certain magnetic parameters such as, in particular, the collapse field. Also adjustable, by appropriate choice of substituent elements, are properties such as magnetization, Curie temperature, magneto-optic rotation, and magnetostriction.

Device manufacture in accordance with the invention involves liquid-phase epitaxial growth or deposition on at least one, and preferably several substrates having lattice parameters which are compatible with those of the layers to be deposited; e.g., for the growth of magnetic iron garnet layers, gadolinium-gallium garnet substrates are suitable in this respect for many compositions of interest. Typically, five or more, or even ten or more substrates are processed upon simultaneous dipping of a vertical stack of essentially horizontally-positined substrates. In the interest of minimizing melt-depletion effects, preferred vertical spacing of substrates is at least 1/20 of substrate diameter. And, in the interest of efficient utilization of available melt depth, such preferred spacing is less than substrate diameter and preferably less than one-half of substrate diameter. See the above-cited paper by Blank et al. for illustrations of substrate holders as may be conveniently used in the practice of the invention.

Epitaxial growth is from a melt containing desired layer constituents, as well as a flux component which acts as solvent for the layer constituents. During growth, the composition of the melt and its temperature are such that the melt is undercooled (supersaturated) with respect to layer constituents at least in a vicinity of a substrate. The melt includes lead oxide as a fluxing agent in a preferred amount of at least 15 mole percent and preferably 25 mole percent of the flux components in combination; among typical additional flux components in the deposition of magnetic iron garnet layers are one or several oxides from the group of vanadium pentoxide, tungsten trioxide, molybdenum trioxide, and chromium trioxide. In the deposition of bismuth-containing iron garnet layers, bismuth trioxide conveniently serves both as a fluxing agent and as a source of bismuth to the layer being deposited. Preferred, in accordance with the invention, are added amounts of boron trioxide, $B_2O_3$, of at least 0.1 mole percent as based on all flux constituent oxides in combination. Amounts of boron trioxide are conveniently limited not to exceed 2 mole percent, and such limitation is further justified in the interest of allowing for a growth temperature which is sufficiently high to essentially preclude the inclusion of lead in a deposited layer.

The efficacy of boron trioxide for enhancement of yield as observed in accordance with the invention is believed to be related to increased solubility of a phase being deposited from a melt containing lead oxide. Increased solubility in turn is believed to result in melt droplets having predominantly glassy structure on a wafer or deposited layer upon withdrawal from a melt. Since such droplets are less prone to adhere to the wafer upon cooling, the risk of the formation of microcracks is lessened.

Among advantages attendant to processing in accordance with the invention are
(i) low defect densities and breakage losses when a plurality of substrates is processed; specifically, upon withdrawal of a stack of substrate wafers after deposition, a yield of 80 percent or more unbroken wafers is readily achieved;
(ii) reduced production costs due to volume production at high levels of yield;
(iii) ease of device processing due to reduced breakage tendency during wafer processing after deposition - due in turn to reduce presence of microcracks on wafers; and
(iv) improved ultimate device quality and device yields.

These advantages can be realized, e.g., in the manufacture of magnetic bubble devices, of magneto-optic active devices (such as, e.g., the magnetic switch or modulator of FIG. 2), and of magneto-optic passive devices such as, e.g., optical isolators as may be used in optical communications systems. (For optical isolators, thickness of a deposited layer may typically be in a range from 100 to 500 micrometers.) The method can be used in the manufacture of devices including magnetic as well as nonmagnetic garnet layers, and its used for the growth of other materials such as, e.g., orthoferrites, magnetoplumbites, spinel, and corundum is not precluded. It is readily appreciated that device manufacture typically involves further processing steps such as, e.g., the deposition and patterning of additional layers (metallic overlay 4 in FIG. 1 and microcircuit 5 in FIG. 2), and that well-known photolithographic techniques may be used in the process.

The following Examples serve to specifically illustrate processing conditions as may be used in the practice of the invention (Example 2), as well as to provide for a comparison with prior-art process (Example 1). All numerical values are approximate or nominal.

EXAMPLE 1

A prior-art melt was prepared by melting 16.20 grams $Y_2O_3$, 2.10 grams $Sm_2O_3$, 2.20 grams $Gd_2O_3$, 1.80 grams $Tb_2O_3$, 18.00 grams CaO, 40.00 grams $SiO_2$, 56.00 grams $GeO_2$, 850.0 grams $Fe_2O_3$, 670.0 grams $V_2O_5$, 10,000.0 grams PbO, and 1,860.0 grams $Bi_2O_3$ in a platinum crucible. The melt was heated by resistance-heating coils to a temperature of 1100 Celsius. A multiple-substrate holder was loaded with 12 gadolinium-gallium garnet substrate wafers 3.0 inches (7.62 centimeters) in diameter and 20 mils (0.0508 centimeter) in thickness, an the substrates were spaced 0.9 centimeter apart in the holder. The melt temperature was lowered to a growth temperature of 825 Celsius, and the loaded holder was immersed in the melt for a duration of 2.5 minutes for growth of 3.5-micrometer epitaxial layers. Inspection of the wafers showed four of them to be broken. The deposition procedure was repeated twice with the same melt and two additional sets of substrate wafers; to compensate for melt depletion, increased immersion times of 2.8 and 3.1 minutes were used, respectively. The first repetition yielded broken wafers only, the second produced two unbroken wafers.

EXAMPLE 2

To the melt of Example 1 above, 20 grams $B_2O_3$ were added as corresponding to 0.6 mole percent of the flux component of the melt (oxides of vanadium, lead, and bismuth in combination). Successive sets of twelve wafers were immersed as described above. A total of 5 sets were processed in this fashion, with deposition times ranging from 3.5 minutes for the first set to 5 minutes for the last set. Out of the 60 wafers only one was found to be broken.

What is claimed is:

1. A method for making a device including an epitaxial layer on at least a portion of a surface of a supporting substrate, said method comprising a step of deposition said layer by exposing at least said portion to a melt which comprises a flux component and layer material constituents, said flux component comprising at least 15 mole percent lead oxide, and said melt being heated at a temperature at which said layer material is supersaturated in said melt at least in a vicinity of said portion, wherein the improvement comprises including in said melt boron trioxide in an amount in the range of 0.1 to 2 mole percent of said flux component.

2. The method of claim 1, a plurality of substrates being simultaneously exposed to said melt.

3. The method of claim 2, said plurality comprising at least five substrates.

4. The method of claim 2, said substrates being essentially horizontally supported as an essentially vertically spaced stack.

5. The method of claim 4, at least 80 percent of said plurality of substrates being whole upon removal from said melt.

6. The method of claim 4, substrate spacing being less than substrate diameter.

7. The method of claim 6, substrate spacing being less than one half substrate diameter.

8. The method of claim 4, substrate spacing being at least 1/20 of substrate diameter.

9. The method of claim 1 in which the material of said epitaxial layer is a magnetic iron garnet material.

10. The method of claim 9, said flux component further comprising at least one oxide selected from the group consisting of vanadium pentoxide, tungsten trioxide, molybdenum trioxide, and chromium trioxide.

11. The method of claim 9, said layer material constituents comprising bismuth trioxide.

12. The method of claim 1, said method further comprising depositing and patterning a metallic layer.

13. The method of claim 12, patterning being by photolithographic means.

14. The device made by the method of claim 1.

* * * * *